United States Patent [19]

Kim et al.

[11] Patent Number: 4,829,215
[45] Date of Patent: May 9, 1989

[54] DISCHARGE REACTION APPARATUS UTILIZING DYNAMIC MAGNETIC FIELD

[75] Inventors: Kyungshik Kim; Owen Wilkinson, both Tokyo, Japan

[73] Assignee: Anelva Corporation, Tokyo, Japan

[21] Appl. No.: 110,622

[22] Filed: Oct. 20, 1987

Related U.S. Application Data

[63] Continuation of Ser. No. 770,926, Aug. 30, 1985, abandoned.

[30] Foreign Application Priority Data

Aug. 31, 1984 [JP] Japan .................. 59-182183
Oct. 3, 1984 [JP] Japan .................. 59-207530

[51] Int. Cl.⁴ ........................................... C23C 15/00
[52] U.S. Cl. .................. 315/111.41; 315/344; 204/298
[58] Field of Search ............ 315/111.41, 338, 344; 204/29.8

[56] References Cited

U.S. PATENT DOCUMENTS

| | | | |
|---|---|---|---|
| 3,283,205 | 11/1966 | DeBolt | 315/111.41 |
| 3,961,103 | 6/1976 | Aisenberg | 204/298 |
| 4,233,109 | 11/1980 | Nishizawa | 204/298 |
| 4,417,968 | 11/1983 | McKelvey | 204/192 R |
| 4,422,916 | 12/1983 | McKelvey | 204/192 R |
| 4,443,318 | 4/1984 | McKelvey | 204/192 R |
| 4,444,643 | 4/1984 | Garrett | 204/192 R |

FOREIGN PATENT DOCUMENTS

| | | |
|---|---|---|
| 45822 | 2/1982 | European Pat. Off. . |
| 99725 | 2/1984 | European Pat. Off. . |
| 2321665 | 11/1973 | Fed. Rep. of Germany . |
| 2800852 | 7/1979 | Fed. Rep. of Germany . |
| 2707144 | 8/1977 | Sweden . |
| 2127043 | 4/1984 | United Kingdom . |

OTHER PUBLICATIONS

Patent Abstracts of Japan, unexamined applications, C field, vol. 7, No. 43, Feb. 19, 1983, The Patent Office Japanese Government, p. 70 C 152 Kokai-No. 57-194 256.

Patent Abstracts of Japan, unexamined applications, C field, vol. 3, No. 14, Feb. 8, 1979, The Patent Office Japanese Government, p. 150 C 36 Kokai-No. 53-141 182.

Primary Examiner—David K. Moore
Assistant Examiner—T. Salindong
Attorney, Agent, or Firm—Pollock, VandeSande & Priddy

[57] ABSTRACT

A discharge reaction apparatus utilizing dynamic magnetic field for subjecting the surface of an object to a depositing or an etching process is disclosed. The apparatus comprises a member for generating dynamic magnetic field along the surface of an electrode and a member for limiting or forbidding the circulating motion of electron around the electrode.

14 Claims, 13 Drawing Sheets

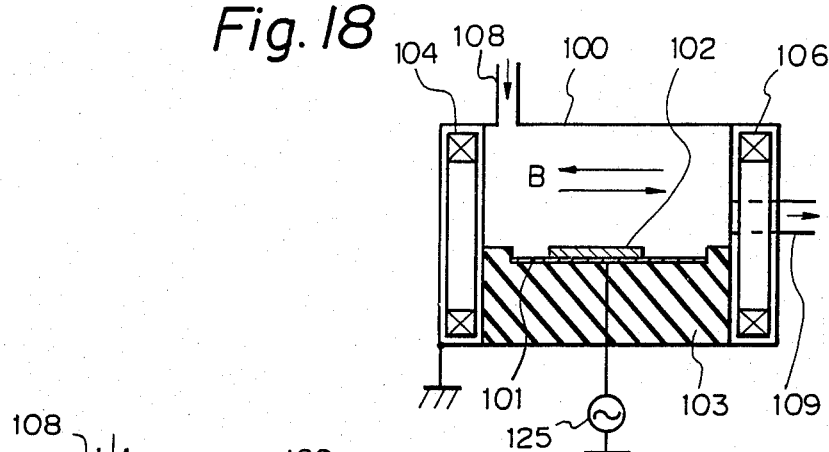
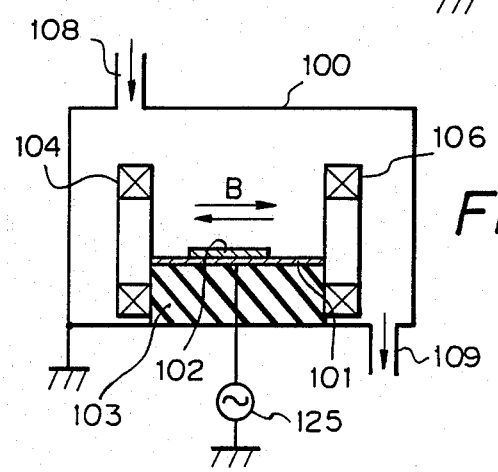
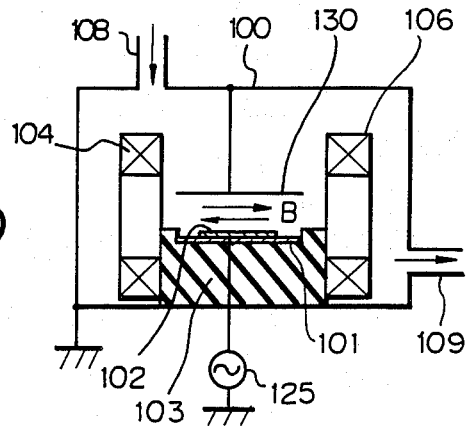

DISCHARGE REACTION APPARATUS UTILIZING DYNAMIC MAGNETIC FIELD

This application is a continuation of Ser. No. 770,926, filed on Aug. 30, 1985, now abandoned.

BACKGROUND OF THE INVENTION

The present invention relates to a discharge reaction apparatus for performing a process such as a film deposition, an etching, a cleaning, a surface hardening and the like on the surface of an object to be processed by using gas plasma generated by discharging in a vacuum.

A typical conventional apparatus utilizes a discharge by diode system. In such a conventional apparatus, for example, when the desired process is performed by disposing an object to be processed on an ungrounded electrode, if plasma density is increased by increasing electric power to be applied to the diode in order to increase the processing speed, the self-bias voltage at the ungrounded electrode becomes increased thereby strengthening ion bombardment resulting in a large damage of the object to be processed. Therefore, the upper value of the power to be supplied to the electrode is limited thereby limiting the processing speed.

In order to resolve this problem there has been proposed a process in which a magnetic field is generated in parallel to the surface of the electrode, or so as to cover the surface of the electrode. A discharge plasma with high density is generated near the electrode with the aid of this magnetic field, and the object is processed with this plasma.

In this case, as is well known, the discharge plasma is generated by a pseudo-cycloid motion which is caused by bending motion of electrons with the force of magnetic field thereby bending an orbit of the motion of the electrons and repeating a collision of the electrons to a wall of the electrode.

Typical conventional apparatus utilizing this phenomenon are shown in FIGS. 1 to 3, in which reference number 10 shows an electrode, 11 pseudo-cycloid motion of electron e, 12 magnetic line of force, B direction of magnetic field, and 13 a vacuum vessel. In FIGS. 1 and 2 the vacuum vessel is omitted.

In the pseudo-cycloid motion 11, the electron e circulates in the given direction along the surface or the periphery of the electrode 10, that is, electron e moves along and/or around the electrode 10. The direction of circulating motion is determined by the direction of magnetic field and the direction of a DC electric field. That is, the electron e circulates in the clockwise direction along tracks on the surface of the flat electrode 10 in an endless manner in FIG. 1, circulates as shown around the pillar electrode 10 in an endless manner in FIG. 2 and circulates in the clockwise direction along the inner wall of the vacuum vessel 13 and a plurality of electrodes 10 which are provided on the vacuum vessel 13 so as to cover the inner wall, in an endless manner in FIG. 3.

If the circulating motion of electrons with its pseudo-cycloid motion along the surface or the periphery of the electrode 10 is forbidden or limited and the pseudo-cycloid motion of the electrons is performed on only the desired surface of the electrode 10 as shown in FIGS. 4 and 5, the plasma with high density will be obtained and thus the process with high speed will be performed. The apparatus as shown in FIGS. 4 and 5, however, are not yet realized. In FIGS. 4 and 5, reference numeral 14 is an insulator and 15 is a barrier formed by an insulator. These insulators serve to limit or forbid the circulating motion of electrons.

The reason why the apparatus shown in FIGS. 4 and 5 are not realized is that the circulating motion of an electron is limited in one direction as described above, and if the barrier member for forbidding or limiting the circulating motion of the electron is present, the electron is collided with the barrier member resulting in a skip or jump of the electron. But the electron cannot circulate in the opposite direction and thus can only circulate in the original direction thereby staying near the barrier member so that, as shown in FIG. 6 by a plurality of dots, the density distribution of plasma 300 becomes large in gradient, that is, nonuniform and thus the process of the object subjected to this plasma becomes nonuniform.

SUMMARY OF THE INVENTION

It is an object of the present invention to overcome the above described disadvantages of the conventional discharge reaction apparatus.

It is another object of the present invention to provide a discharge reaction apparatus capable of generating plasma with high density and superior uniformity near and along the surface of the electrode, thereby performing a process with high quality and high speed.

According to the present invention there is provided a discharge reaction apparatus utilizing dynamic magnetic field comprising a vacuum vessel incorporating at least one electrode therein, means for introducing a given amount of gas into the vacuum vessel, means for controlling pressure in the vacuum vessel, means for generating discharge in the vacuum vessel by supplying electric power to the electrode thereby processing soon to be processed object disposed in the vacuum vessel, means for generating dynamic magnetic field along the surface of the electrode, and means for limiting or forbidding a circulation motion of electron movement which circulates the electrode. The electrode incorporated in the vacuum vessel has a flat surface portion, along which the dynamic magnetic field is present. The dynamic magnetic field is a circular, elliptic or any other shape rotating magnetic field. The dynamic magnetic field is a sinusoidal, triangular, rectangular or any other shape alternating field.

The means for generating the rotating magnetic field comprises three pairs of exciting coils which are so arranged that each pair of exiting coils is disposed diametrically opposite to the vacuum vessel, and each phase current of a three phase alternating current is applied to these exciting coils thereby generating the rotating magnetic field. The means for generating the rotating magnetic field may also comprise three exciting coils which are so arranged that these coils are disposed in the diametrical direction through an axis of the vacuum vessel, and each phase current of a three phase alternating current is applied to these exciting coils thereby generating the rotating magnetic field. The means for generating the alternating field comprises two exciting coils which are so arranged that the electrode is disposed between the exciting coils, and an alternating current is applied to these exciting coils thereby generating the alternating field parallel to the flat surface portion of the electrode.

The means for limiting or forbidding the circulating motion of electron may comprise inner side walls of the vacuum vessel and an upper surface of an insulator embedding the electrode therein. The means for limiting or forbidding the circulating motion of electron may also consist of the electrode itself comprising at least two side walls which have an upright section. The means for limiting or forbidding the circulation motion of electron movement further may consist of the electrode itself comprising at least two side walls which have a section inclined in the inside direction. The means for limiting or forbidding the circulating motion of electron may yet consist of an insulator embedding the electrode therein, which has at least two upright side walls. The means for limiting or forbidding the circulation motion of electron movement may furthermore consist of an insulator provided on the electrode, which has at least two upright side walls.

BRIEF DESCRIPTION OF THE INVENTION

FIGS. 13 to 24 are vertical and transverse sectional views showing construction of further embodiments of the discharge reaction apparatus according to the present invention;

FIGS. 25(a) to (d) are sectional and perspective views showing construction of ungrounded electrode for use in the apparatus according to the present invention;

FIGS. 26(a) to (d) are sectional and perspective views showing construction of other ungrounded electrode for use in the apparatus according to the present invention; and FIGS. 27 to 31 are sectional views showing construction of further ungrounded electrodes for use in the apparatus according to the present invention.

DESCRIPTION OF THE PREFERRED EMBODIMENTS

Figure 1:
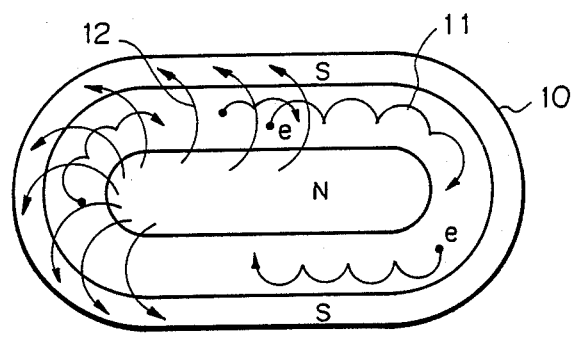
FIGS. 1 to 3 are explanatory views showing motion of electron in conventional discharge reaction apparatus.
Figure 2:
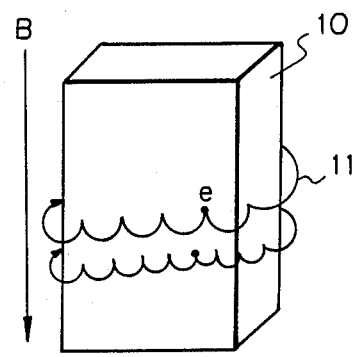
Figure 3:
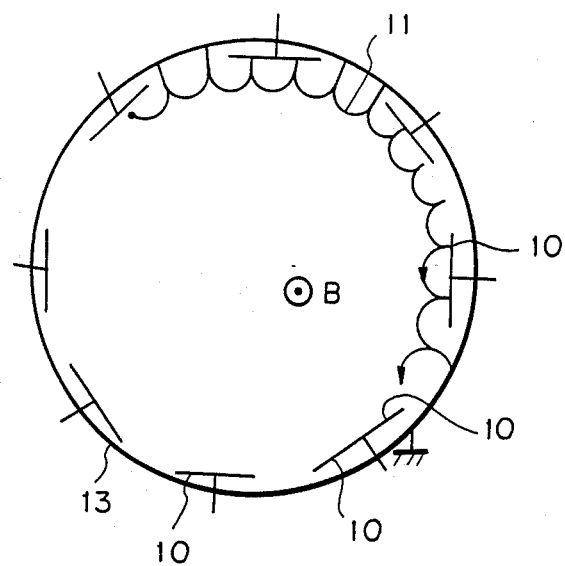
Figure 4:
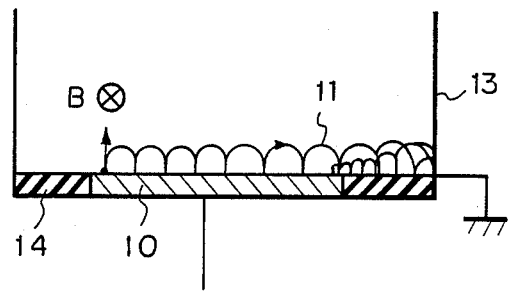
FIGS. 4 and 5 are explanatory views, schematically illustrated in cross-section, showing motion of electron in case of limiting or forbidding a circulating motion of electron in order to increase plasma density.
Figure 5:
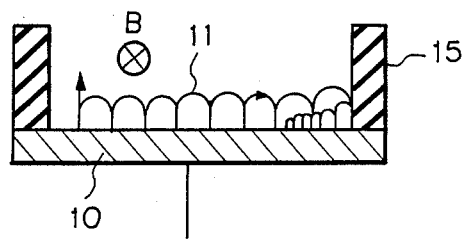
Figure 6:
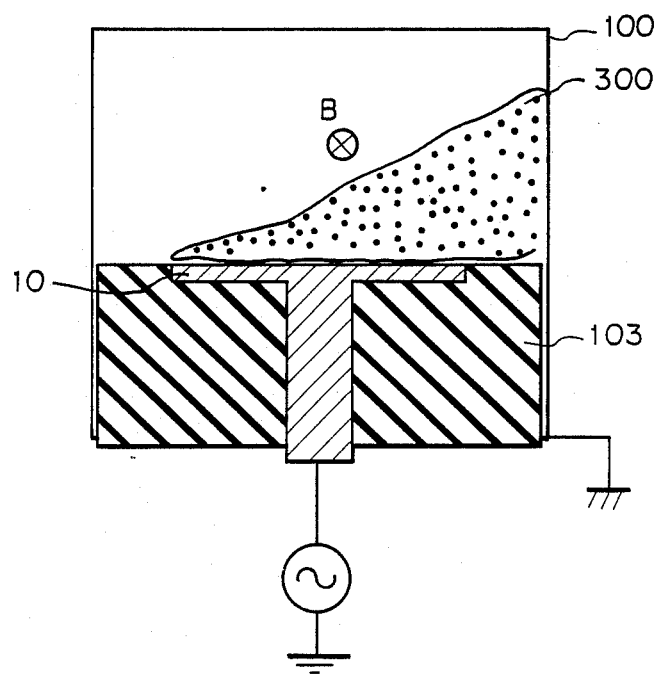
FIG. 6 is an explanatory view, schematically illustrated in cross-section, showing a distribution of plasma density in the apparatus shown in FIGS. 4 and 5.
Figure 7:
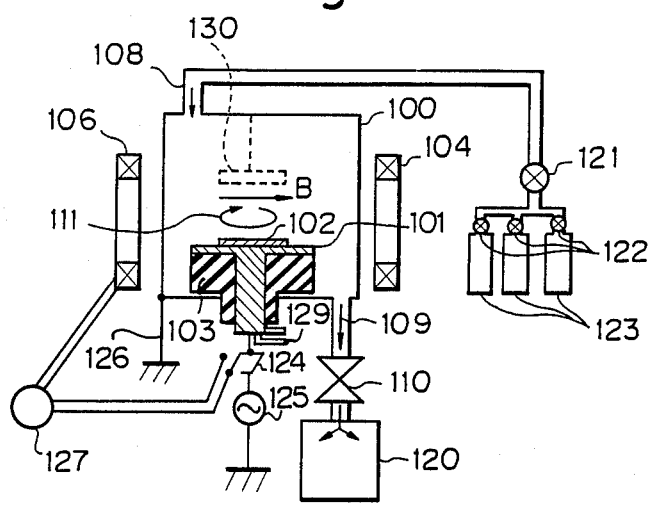
FIG. 7 is a schematic view, partially illustrated in cross-section, showing construction of one embodiment of a discharge reaction apparatus according to the present invention.

FIG. 7 is a schematic view showing construction of one embodiment of a discharge reaction apparatus according to the present invention.

In FIG. 7 reference numeral 100 shows a grounded metal vacuum vessel in which to be processed object 102 is placed on an ungrounded electrode 101 which is covered by or embedded in an insulator 103 of fluorethylen resin. A processing gas of a given component and given mixing ratio is introduced into the vacuum vessel 100 from a gas inlet 108 through a variable leak valve 121 by a plurality of gas bombs 123 each having a valve 122. The processing gas flows through a surface of the electrode 101 and is exhausted from an outlet 109 through a pressure adjusting valve 110 by a pump 120. Reference numeral 126 shows an earth line for the grounded metal vacuum vessel 100.

A high frequency electric power is applied between the vacuum vessel 100 and the electrode 101 from a power supply source 125 through a switch 124. At the same time a three phase alternating current or a single phase alternating current is supplied from a supply source 127 through the switch 124 to coils 104, 105 and 106, which may be provided outside or inside the vacuum vessel 100, thereby producing alternating or rotating magnetic field B parallel to a flat surface portion of the electrode 101. Reference numeral 111 shows one example of the direction of the rotating magnetic field B The side surface of the insulator 103 prevents electrons from circulating the electrode 101 with the pseudocycloid motion. The electrons, however, disperse without staying, thereby generating or producing plasma with uniformity and high density near the flat surface portion of the electrode 101 since the direction of the field B is rotating or alternating. The uniformity herein means that mean value in time of plasma is uniform at every site on the flat surface portion of the electrode. The uniformity and high density plasma thus formed can process the object 102 with high speed and high uniformity. The electrode 101 is also provided with pipe 129 for fluid in order to cool the electrode or make thermal adjustment on the electrode.

In case of fixing the field B as in the conventional apparatus, the processing speed of the object is high, but uniformity of the speed is inferior. For example, when $CHF_3$ gas is introduced in the vacuum vessel 100 and a $SiO_2$ film on the surface of a Si wafer with 5 inches as the object 102 is etched, the uniformity of etch rate is $\pm 40\%$. According to the embodiment of the present invention when three phase alternating current is supplied to the cols 104, 105 and 106 from the supply source 127, the uniformity of etch rate can be increased to $\pm 5\%$. In this case the etch rate is 5000 Å/min or more.

According to the apparatus shown in FIG. 7 it is possible to discharge in the wide pressure region of $10^{-5} \sim 1$ Torr thereby producing plasma with high density and high uniformity.

Figure 12:
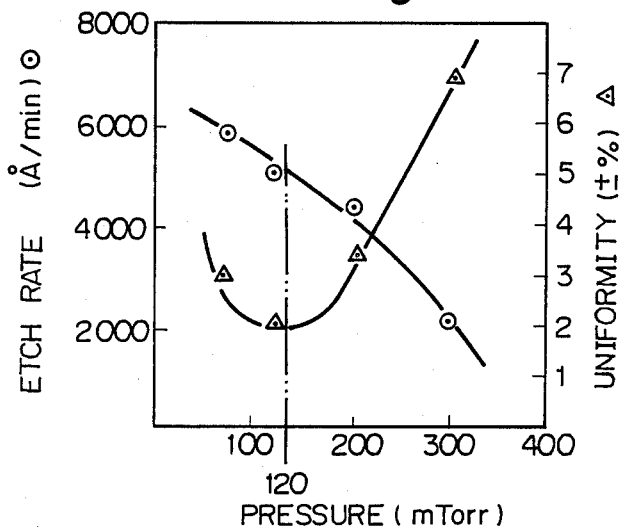
FIG. 12 is a graph showing pressure-etching characteristic of the apparatus shown in FIG. 7.

FIG. 12 shows an etching property or characteristics obtained when a $SiO_2$ film formed on the Si substrate 102 is etched with a mixed gas of $CHF_3$ and $CO_2$ by using the apparatus shown in FIG. 7. In this case, a cylindrical chamber of 400 mm$\phi \times$ 500 mm is used as a vacuum vessel. Gas flow is 140 SCCM Standard Cubic Centimeter i.e. having a diameter of 400 mm, the mixed gas is a mixture of $CHF_3$ with $CO_2$ of 5%. Flux density of rectangular alternating field B is 200 gauss with alternating frequency of 20 cycle/min. High frequency power is 650 W with a frequency of 13.56 MHz. The substrate of 5 inch$\phi$ is placed on the electrode having the flat surface portion of 200 mm$\phi$.

Substantially the same result as that described above is obtained by using the alternating magnetic field B produced by the commercially obtained current with 50 Hz.

When the etching characteristic of present apparatus shown in FIG. 12 is compared with the characteristic of conventional parallel plane apparatus, the uniformity of etching is substantially same for both apparatus, but the etch rate of the present apparatus is faster than that of the conventional apparatus by ten times.

As found from FIG. 12, one of the best uniformity of ±2.0% is obtained at the pressure of 120 mTorr, and the etch rate of $SiO_2$ is 5100 Å/min. On the contrary, with the direct magnetic field the uniformity of the etch rate is ±40%.

The larger the three phase or single phase alternating current applied to the coils 104, 105 and 106, the greater the etching at low pressure region so that the etch rate of 7000 Å/min or more is obtained at the pressure of few mTorr to few tenth mTorr.

According to the present invention any desired film may also be deposited on the substrate, for example 130 (used with grounded or floating potential) placed near the electrode 101 by introducing gas necessary to plasma CVD into the vacuum vessel 100. When the substrate 130 is used as a grounded electrode, the vacuum vessel 100 may be formed of such an insulator as, for example, fluorine resin, glass or the like.

In this case, the introduced gas and the deposited film are as follows:

$SiH_4 + N_2 + NH_3 \rightarrow Si_3H_4$ film 
$SiH_4$ or $Si_2H_6$ etc $\rightarrow$ a-Si:H film 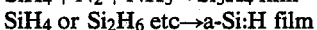
$SiH_4 + N_2O \rightarrow SiO_2$ film 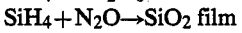

Quality, uniformity and deposit speed of the film are the same or superior to those of conventional apparatus, which means that the apparatus shown in FIG. 7 is extremely suitable for use as plasma CVD apparatus.

FIGS. 8 to 11 show other embodiments of the apparatus according to the present invention.

Figure 8:
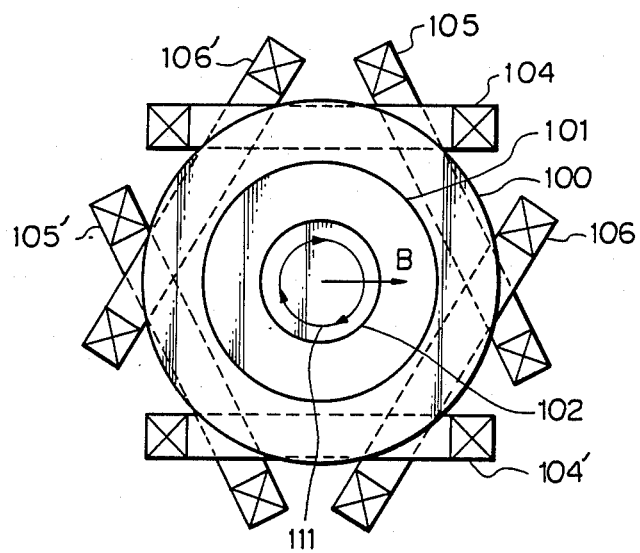
FIGS. 8 and 9 are plan views showing arrangement of electro-magnetic coils for producing rotating magnetic field.

In the apparatus shown in FIG. 8, each phase current of a three phase alternating current is supplied to six exciting coils 104 and 104', 105 and 105', and 106 and 106' which encompass the vacuum vessel 100 thereby producing a rotating magnetic field.

Figure 9:
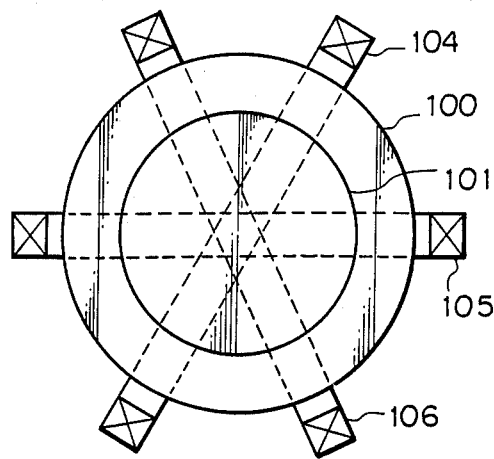

In the apparatus shown in FIG. 9, each phase current is supplied to three exciting coils 104, 105 and 106 thereby producing the rotating magnetic field.

Figure 10:
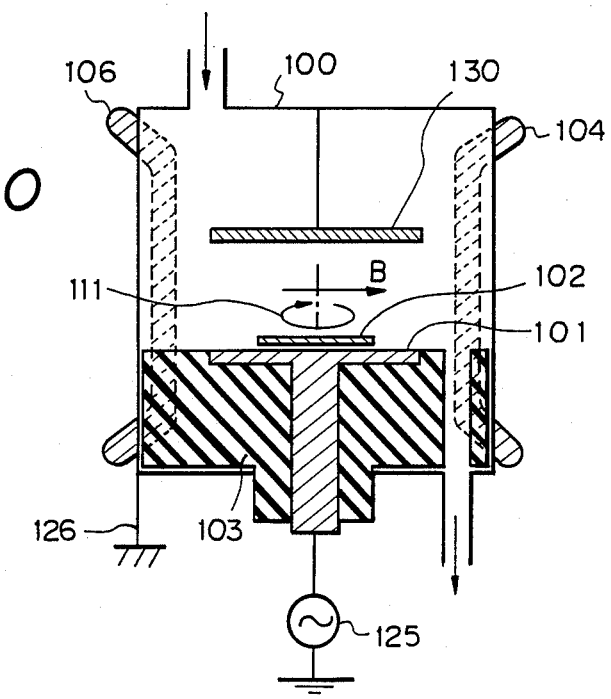
FIGS. 10 and 11 are schematic views, partially illustrated in cross-section, showing construction of other embodiments of the discharge reaction apparatus according to the present invention.

In the apparatus shown in FIG. 10, the electrode 101 is fully embedded in an insulator thereby forbidding a circulating motion of electron movement around the electrode 101. In this embodiment, saddle coils are utilized thereby increasing exciting efficiency and miniaturizing the apparatus.

Figure 11:
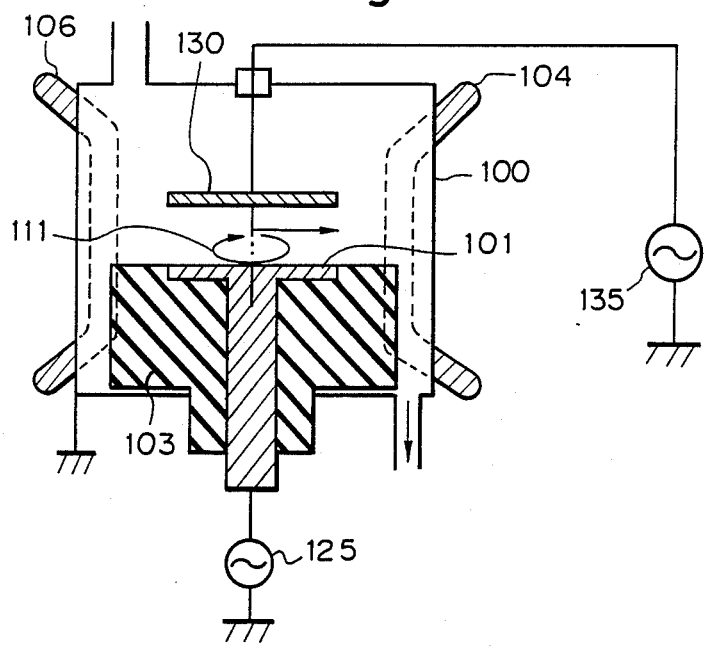

In the apparatus shown in FIG. 11, the vacuum vessel 100 is grounded and the power is supplied to the electrodes 101 and 130 by respective supply sources 125 and 135.

Figure 13B:
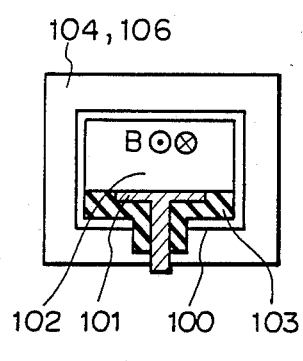
Figure 13A:
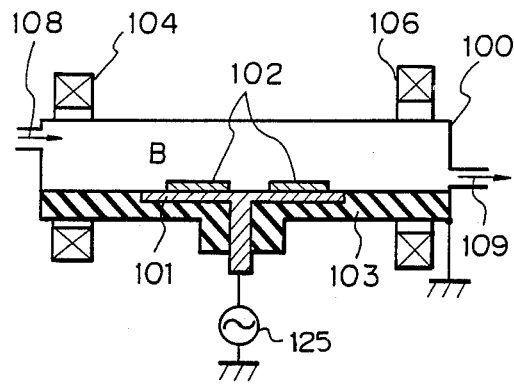

FIGS. 13 to 24 show further embodiments of the discharge reaction apparatus according to the present invention In the apparatus shown in FIGS. 13(a) and 13(b), the upper surface of the insulator 103 forms a barrier for forbidding a circulating motion of electron and spatially localizing the pseudo-cycloid motion of electron movement on the desired surface of the electrode.

Figure 14A:
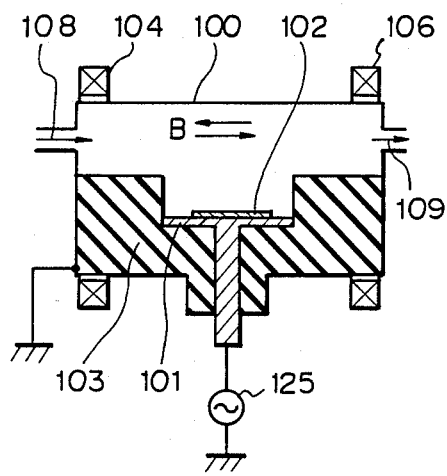
Figure 14B:
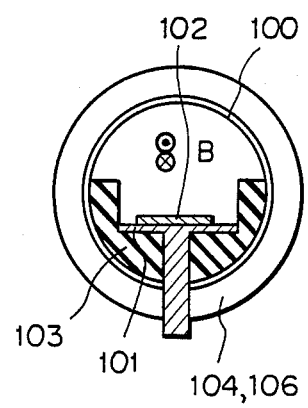

In the apparatus shown in FIGS. 14(a) and 14(b), the barrier for forbidding the circulation motion of electron movement is constructed by the side wall of pit which incorporates the electrode 101 therein. The pit is provided in the insulator 103, by which the cylindrical vacuum vessel 100 is embedded at the underside of the electrode 101.

Figure 15A:
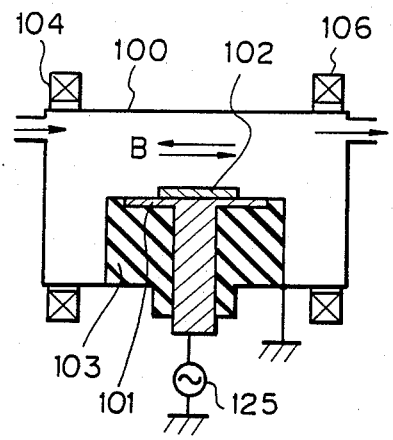
Figure 15B:
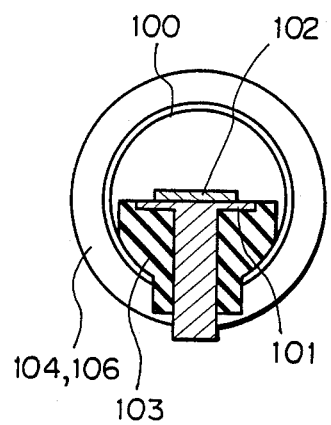

The barrier for forbidding the circulating motion of electron is formed by the inner side wall at the center of the cylindrical vacuum vessel 100 and the upper surface of the insulator 103 in the apparatus shown in FIGS. 15(a) and 15(b).

Figure 16:
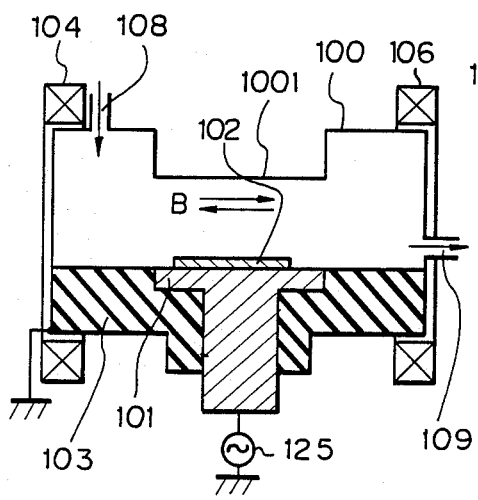
Figure 17:
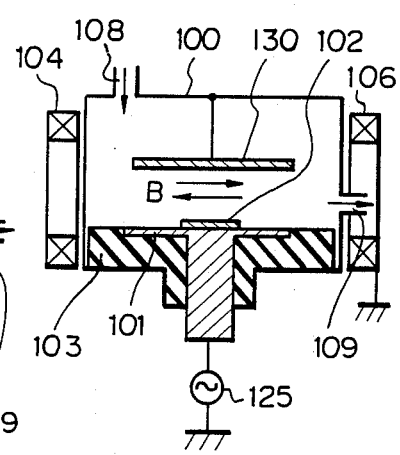

In the apparatus shown in FIG. 16, a recess is provided at a portion 1001 of the vacuum vessel 100 and over the electrode 102 in order to increase the power efficiency. The apparatus shown in FIG. 17 is provided with a grounded electrode 130 instead of the above recess. The circulation motion of electrons movement is prevented by the upper surface of the insulator 103 in both embodiments shown in FIGS. 16 and 17.

In the apparatus shown in FIGS. 18, 19 and 20, the exciting coils 104 and 106 for producing an alternating field B are disposed in the vacuum vessel 100 thereby miniaturizing the apparatus.

Figure 21:
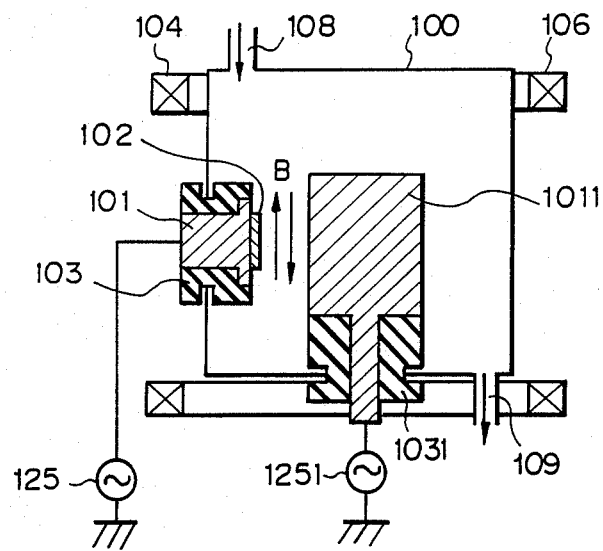
Figure 22:
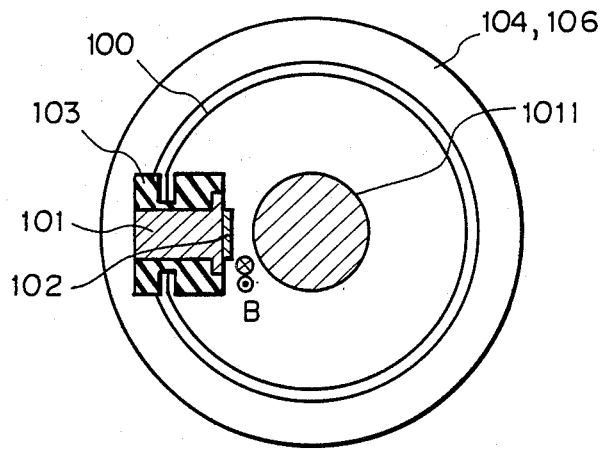

In the embodiments shown in FIGS. 21 and 22, the ungrounded electrode 101 is mounted to a portion of the side wall of the cylindrical vacuum vessel 100 together with the insulator 103 which prevents the circulating motion of electron. The high frequency power is supplied to the electrode 101 by a supply source 125. At the same time an electrode 1011 for permitting the circulating motion of electron is also provided to the axis portion of the vessel 100 together with an insulator 1031. The high frequency power is supplied to the electrode 1011 by a supply source 1251. Both high frequency powers are controlled in frequency and phase.

In the present invention, it is possible to control the etching process at a very high speed (for example, in case of etching $SiO_2$, etch rate is 1 μm/min ). The uniformity of etch rate is ±5% for the alternating field B and ±40% for the direct magnetic field.

Figure 23:
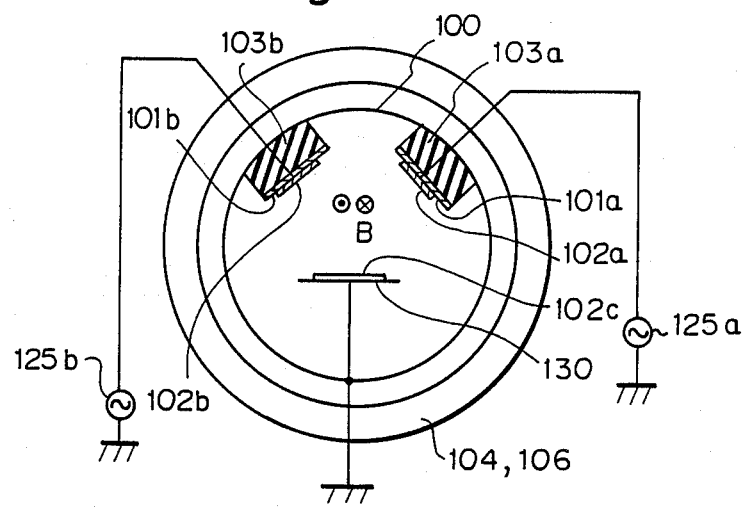

In the apparatus shown in FIG. 23, two electrodes 101a and 101b as well as two insulators 103a and 103b for limiting or forbidding the circulating motion of electron are provided to the side wall of the vacuum vessel 100 and the grounded electrode 103 is arranged opposite thereto. The objects to be processed 102a, 102b or 102c are placed on the electrodes 101a, 101b and 130.

Figure 24:
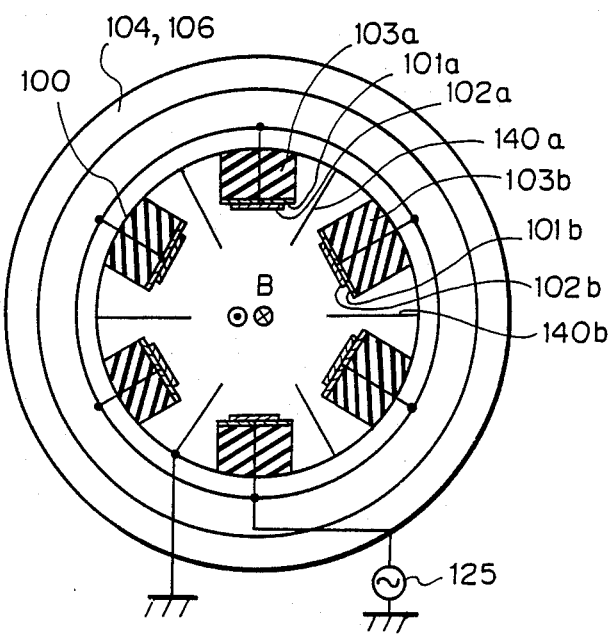

In the apparatus shown in FIG. 24, six ungrounded electrodes 101a, 101b, ... are arranged to the side wall of the vacuum vessel 100 at equal distance together with six insulators 103a, 103b, ..., respectively. Shield members 140a, 140b, ... are provided between the respective electrodes 101a, 101b, ... The high frequency power is supplied to the respective electrodes 101a, 101b, ... by common supply source 125. In this embodiment the barrier for limiting or forbidding the circulation motion of electron movement is formed by the shield member 140 and the side wall of the insulator 103.

FIGS. 25 to 31 show means or barrier for limiting or forbidding the circulating motion of electron.

In the embodiments shown in FIGS. 25(a) to 25(d) and 26(a) to 26(d), the barrier is formed by the electrode 101 itself comprising at least two side walls 1012 which have an upright section or a section inclined in the inside direction. These side walls 1012 have the same material as that of the electrode 101 and are made integral with the electrode. The shape of these side walls 1012 are formed as shown in FIGS. 25(a) to 25(d) and FIGS. 26(a) to 26(d)

Figures 25A, 25B, 25C:
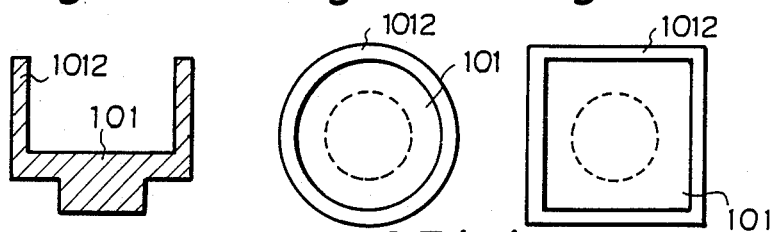
Figure 25D:
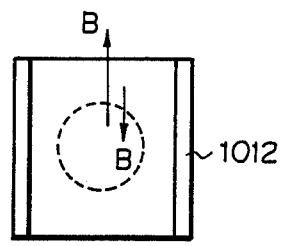
Figures 26A, 26B, 26C:
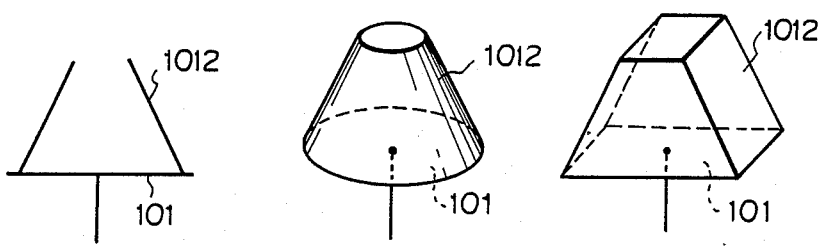
Figure 26D:
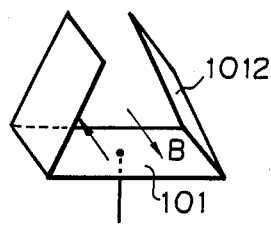

That is, the side wall 1012 of the electrode 101 may be constructed in the form of a right circular cylinder (FIG. 25(b)), a right prism (FIG. 25 (c)), parallel planer plates (FIG. 25(d)), a truncated cone (FIG. 26(b)), a truncated prism (FIG. 26(c)), and opposite inclined planar plates (FIG. 26(d)), respectively. FIGS. 25(a) and 26(a) are cross sectional views showing the structure of FIGS. 25(b) to 25(d) and FIGS. 26(b) to 26(d), respectively.

It is possible to repel electrons collided with the side wall since the electrode has upright sidewall and is biased at negative voltage so that density of plasma can be increased in a space formed by the side walls and the electrode surface and thus the etch rate of the substrate to be treated can be increased.

According to the embodiment shown in FIG. 26, it is possible to trap or capture the emitted electrons in the side wall 1012 without escaping outside of the electrode 101 thereby obtaining high density plasma and increasing the etch rate of the substrate to be processed.

In the embodiments shown in FIGS. 27 to 30 the barrier is formed by the insulator 103, by which the reflection of electron is performed.

The insulator 103 may be formed in the same shape as that of side walls shown in FIGS. 25 and 26. Even in case of using insulator, electrons are reflected, thereby increasing plasma density and thus etch rate.

Figure 27:
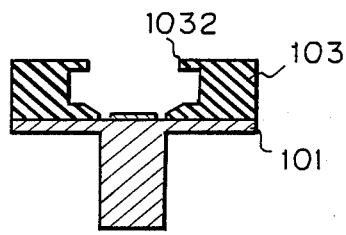

The insulator 103 shown in FIG. 27 has projections 1032, by which the reflected electrons can not escaped.

Figure 28:
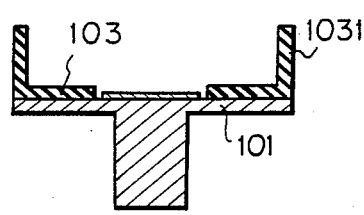

The insulator 103 shown in FIG. 28 has upright edges 1031, by which plasma density is increased so that high processing speed can be obtained, and uniformity at the edge of the substrate to be processed becomes improved.

Figure 29:
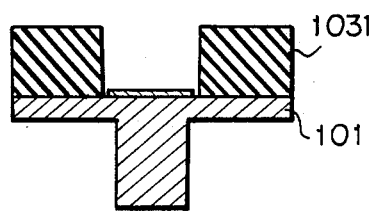
Figure 30:
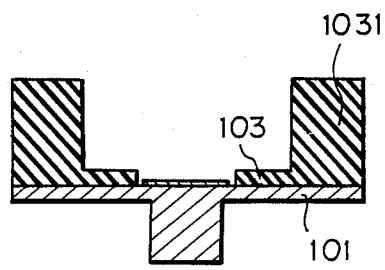

In the embodiments shown in FIGS. 29 and 30 the thickness of the insulator is increased thereby trapping plasma with high density.

Figure 31:
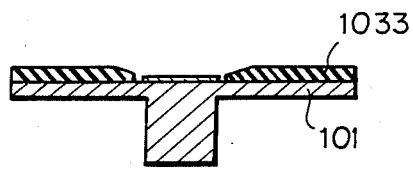

In the embodiment shown in FIG. 31 a ring-shaped insulator cover 1033 is provided around the substrate to be processed so that uniform electric field can be obtained on the surfaces of the substrate and the insulator and thus better uniformity of etching can be obtained.

What is claimed is:

1. A discharge reaction apparatus having vacuum vessel, comprising:
   at least one electrode incorporated in the vacuum vessel;
   means for introducing a given amount of processing gas into the vacuum vessel;
   means for controlling pressure in the vacuum vessel;
   means for generating discharge plasma from the gas in the vacuum vessel, the generating means including means for supplying electric power to the electrode to produce an electric field perpendicular to the surface of the electrode for processing a to be processed object disposed in the vacuum vessel;
   means for generating a dynamic magnetic field parallel to the surface of the electrode to provide a high density plasma near the electrode, the plasma containing electrons having a circulating motion;
   means for limiting the circulating motion of the electrons circulating the electrode;
   wherein the electric field and the magnetic field are perpendicular to each other, thereby processing the object with uniform and high density plasma.

2. A discharge reaction apparatus as claimed in claim 1, wherein the electrode incorporated in the vacuum vessel has a flat surface portion along which the dynamic magnetic field is present.

3. A discharge reaction apparatus as claimed in claim 2, wherein the dynamic magnetic field is a rotating magnetic field.

4. A discharge reaction apparatus as claimed in claim 2, wherein the dynamic magnetic field is an alternating field.

5. A discharge reaction apparatus as claimed in claim 3, wherein the means for generating the rotating magnetic field comprises three pairs of excitation coils, each pair of excitation coils being disposed diametrically opposite to the vacuum vessel, and each phase current of a three phase alternating current being applied to these excitation coils for generating the rotating magnetic field.

6. A discharge reaction apparatus as claimed in claim 3, wherein the means for generating the rotating magnetic field comprises three excitation coils, the coils being disposed in the diametrical direction through an axis of the vacuum vessel, and each phase current of a three phase alternating current being applied to these excitation coils for generating the rotating magnetic field.

7. A discharge reaction apparatus as claimed in claim 4, wherein the means for generating the alternating field comprises two excitation coils, the electrode being disposed between the excitation coils, and an alternating current being applied to these excitation coils for generating the alternating field parallel to the surface of the electrode.

8. A discharge reaction apparatus as claimed in claim 7, wherein the excitation coils are arranged outside the vacuum vessel.

9. A discharge reaction apparatus as claimed in claim 7, wherein the excitation coils are arranged inside the vacuum vessel.

10. A discharge reaction apparatus as claimed in claim 1, wherein the means for limiting the circulating motion of electrons comprises inner side walls of the vacuum vessel and an upper surface of an insulator having the electrode embedded therein.

11. A discharge reaction apparatus as claimed in claim 1, wherein the means for limiting the circulating motion of electrons comprises the electrode itself, the electrode having at least two side walls which have an upright section.

12. A discharge reaction apparatus as claimed in claim 1, wherein the means for limiting the circulating motion of electrons comprises the electrode itself, the electrode having at least two side walls which have a section inclined in the inside direction.

13. A discharge reaction apparatus as claimed in claim 1, wherein the means for limiting the circulating motion of electrons comprises an insulator having the electrode embedded therein, which has at least two upright side walls.

14. A discharge reaction apparatus as claimed in claim 1, wherein the means for limiting the circulating motion of electrons comprises an insulator provided on the electrode, which has at least two upright side walls.

* * * * *

UNITED STATES PATENT AND TRADEMARK OFFICE
CERTIFICATE OF CORRECTION

PATENT NO. : 4,829,215
DATED : May 9, 1989
INVENTOR(S) : Kyungshik Kim, et al.

It is certified that error appears in the above-identified patent and that said Letters Patent is hereby corrected as shown below:

In the Abstract, line 6, change "circulating" to --circulation--.

Column 2, line 49, change "exiting" to --exciting--.

Column 3, line 62, after "which" insert --a--.

Column 4, line 16, after "B" insert --.--.

Column 4, line 39, change "cols" to --coils--.

Column 4, line 59, before "is" insert --, i.e. having a diameter of 5 inches,--.

Column 4, line 60, after "200 mmφ" insert --(200 mm diameter)--

Column 6, line 8, change "electrons" to --electron--.

Column 7, line 22, change "escaped" to --escape--.

Signed and Sealed this

Twelfth Day of December, 1989

*Attest:*

JEFFREY M. SAMUELS

*Attesting Officer*　　*Acting Commissioner of Patents and Trademarks*